United States Patent
Li et al.

(10) Patent No.: US 11,778,848 B2
(45) Date of Patent: Oct. 3, 2023

(54) FLEXIBLE DISPLAY PANEL, TOUCH DISPLAY MODULE, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fan Li, Beijing (CN); Xinpeng Wang, Beijing (CN); Xiaolong Zhu, Beijing (CN); Wenxiao Niu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 94 days.

(21) Appl. No.: 17/423,911

(22) PCT Filed: Jan. 26, 2021

(86) PCT No.: PCT/CN2021/073841
§ 371 (c)(1),
(2) Date: Jul. 19, 2021

(87) PCT Pub. No.: WO2021/164510
PCT Pub. Date: Aug. 26, 2021

(65) Prior Publication Data
US 2022/0344615 A1    Oct. 27, 2022

(30) Foreign Application Priority Data

Feb. 20, 2020    (CN) .......................... 202020190037.6

(51) Int. Cl.
*G06F 3/041* (2006.01)
*H10K 50/84* (2023.01)
(Continued)

(52) U.S. Cl.
CPC ........... *H10K 50/84* (2023.02); *G06F 3/0412* (2013.01); *H01L 25/18* (2013.01);
(Continued)

(58) Field of Classification Search
None
See application file for complete search history.

(56) References Cited

U.S. PATENT DOCUMENTS

2020/0013987 A1    1/2020  Lee
2020/0026391 A1*   1/2020  Tomokawa ............ H05K 1/118

FOREIGN PATENT DOCUMENTS

CN        108447890 A  *  8/2018  ........... B32B 27/281
CN        108962029 A     12/2018
(Continued)

OTHER PUBLICATIONS

Translation of CN-105789252-B into English; Tao et al. (Year: 2019).*

(Continued)

*Primary Examiner* — Brian M Butcher
(74) *Attorney, Agent, or Firm* — Ling Wu; Stephen Yang; Ling and Yang Intellectual Property

(57) ABSTRACT

A flexible display panel, touch display module and display device are provided. The flexible display panel includes a display substrate and a spacer on a side of the display substrate away from a display side. The spacer includes a first side surface facing the display side of the display substrate and a second side surface away from the display side. The display substrate includes an arc surface region close to an edge and a panel bending pad bent to the side of the display substrate away from the display side and fixed on the second side surface of the spacer. Shape of the first side surface of the spacer is consistent with that of portion of the display substrate facing first side surface of the spacer.

(Continued)

Portion of second side surface of the spacer corresponding to the arc surface region is a surface including a plane or multiple planes.

18 Claims, 5 Drawing Sheets

(51) Int. Cl.
   *H01L 25/18* (2023.01)
   *H10K 102/00* (2023.01)

(52) U.S. Cl.
   CPC .. *G06F 2203/04102* (2013.01); *H10K 50/841* (2023.02); *H10K 2102/311* (2023.02)

(56) References Cited

FOREIGN PATENT DOCUMENTS

| | | | | |
|---|---|---|---|---|
| CN | 105789252 B | * | 4/2019 | ........... H01L 25/167 |
| CN | 109559646 A | | 4/2019 | |
| CN | 110277435 A | | 9/2019 | |
| CN | 110570753 A | | 12/2019 | |
| CN | 110690252 A | | 1/2020 | |
| CN | 210836910 U | | 6/2020 | |
| KR | 10-2014-0108826 A | | 9/2014 | |

OTHER PUBLICATIONS

Translation of CN-108447890-A into English; Dai et al. (Year: 2018).*
International Search Report for PCT/CN2021/073841 dated Mar. 17, 2021.

* cited by examiner

US 11,778,848 B2

FLEXIBLE DISPLAY PANEL, TOUCH DISPLAY MODULE, AND DISPLAY DEVICE

CROSS-REFERENCE TO RELATED APPLICATIONS

The present application is a U.S. National Phase Entry of International Application No. PCT/CN2021/073841 having an international filing date of Jan. 26, 2021, which claims priority to Chinese Patent Application No. 202020190037.6, filed to the CNIPA on Feb. 20, 2020 and entitled "Flexible Display Panel, Touch Display Module, and Display Device". The above-identified applications are hereby incorporated into this application by reference in their entirety.

TECHNICAL FIELD

Embodiments of the present disclosure relate to, but are not limited to, the technical field of display, and in particular to a flexible display panel, a touch display module, and a display device.

BACKGROUND

As an advantage of a flexible display module (flexible organic light-emitting diode (OLED)), a display screen of a display device such as a mobile phone may be curved, and there may be three or four curved sides, etc. When a lower frame of the flexible display module extends into an arc surface region (i.e., a portion where an edge is curved), there are problems of line crack, peeling, and difficulty in fixing along the arc surface region after a flexible printed circuit (TFPC) is reversely bent.

SUMMARY

The following is a summary of the subject matter described in detail herein. The summary is not intended to limit the scope of protection of the claims.

An embodiment of the present disclosure provides a flexible display panel, which includes a display substrate and a spacer arranged on a side of the display substrate away from a display side. The spacer includes a first side surface facing the display side of the display substrate and a second side surface away from the display side of the display substrate. The display substrate includes an arc surface region close to an edge and a panel bending pad bent to the side of the display substrate away from the display side. The panel bending pad is fixed on the second side surface of the spacer. The shape of the first side surface of the spacer is consistent with the shape of a portion of the display substrate facing the first side surface of the spacer. A portion of the second side surface of the spacer corresponding to the arc surface region is a surface including a plane or a plurality of planes.

Another embodiment of the present disclosure provides a touch display module, which includes: the flexible display panel and a touch assembly arranged on a display side of the flexible display panel. The touch assembly includes a touch layer and a flexible printed circuit connected to the touch layer. The flexible printed circuit is bent to a side of the flexible display panel away from the display side. The flexible printed circuit is fixed on a panel bending pad.

Yet another embodiment of the present disclosure provides a display device, which includes the touch display module.

Other aspects will become apparent upon reading and understanding the accompanying drawings and detailed description.

BRIEF DESCRIPTION OF DRAWINGS

The accompanying drawings are used to provide a further understanding of the technical solutions of the present disclosure, constitute a part of the specification, serve to explain the technical solutions of the present disclosure together with the embodiments of the present disclosure, and are not to be construed as limiting the technical solutions of the present disclosure.

DETAILED DESCRIPTION

The technical solution of the present disclosure will be described below with reference to the accompanying drawings and the embodiments. It can be appreciated that the embodiments described herein are merely illustrative of the present disclosure and do not limit the present disclosure.

As described above, when a lower frame of a flexible display module extends into an arc surface region (i.e., a portion where an edge is curved), there are the following problems:

1) When a panel bending pad of a display panel bent reversely is bent along the arc surface region, a problem of line crack exists.

2) When the panel bending pad of the display panel bent reversely is bent along the arc surface region, it cannot be firmly adhered to a spacer on a back side of a display substrate, thereby a problem of peeling is caused.

3) It is difficult to fix a flexible printed circuit (TFPC) of a touch assembly of a touch display module after being bent reversely along the arc surface region.

Figure 1:
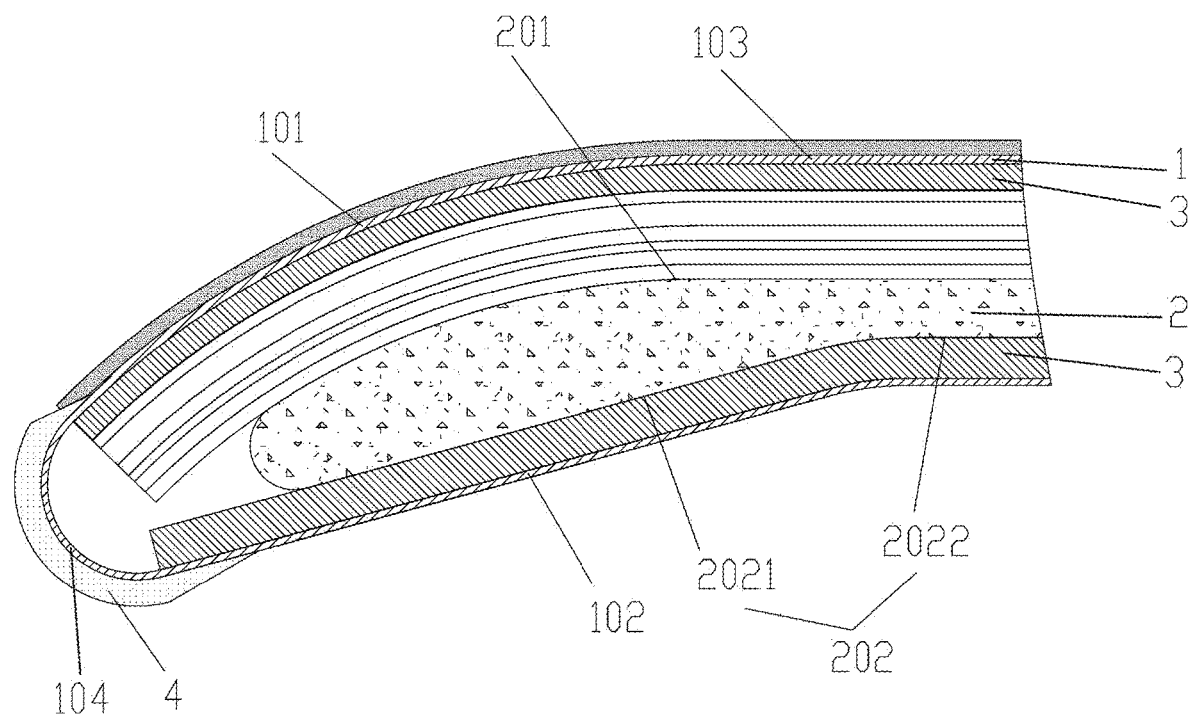
FIG. 1 is a partial cross-sectional view of a flexible display panel according to an embodiment of the present disclosure.
Figure 2:
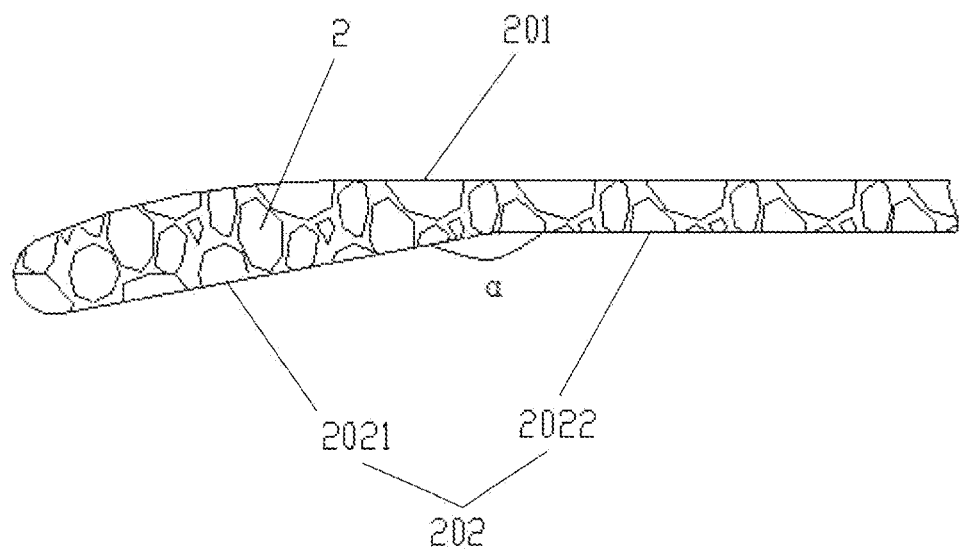
FIG. 2 is a partial cross-sectional structure view of a spacer of the flexible display panel of FIG. 1.

As shown in FIGS. 1 and 2, an embodiment of the present disclosure provides a flexible display panel, which includes a display substrate 1 and a spacer 2 arranged on a side of the display substrate 1 away from a display side. The spacer 2 includes a first side surface 201 facing the display side of the display substrate 1 and a second side surface 202 away from the display side of the display substrate 1. The display substrate 1 includes an arc surface region 101 close to an edge and a panel bending pad 102 bent to the side of the display substrate 1 away from the display side. The panel bending pad 102 is fixed on the second side surface 202 of the spacer 2. A shape of the first side surface 201 of the spacer 2 is consistent with a shape of a portion of the display substrate 1 facing the first side surface 201. A portion of the second side surface 202 of the spacer 2 corresponding to (e.g. in positional correspondence with) the arc surface region 101 is a surface including a plane or a plurality of planes.

According to the flexible display panel of the embodiment of the present disclosure, the spacer 2 may play a supporting role. The shape of the first side surface 201 of the spacer 2 facing the display side of the display substrate 1 is set to be consistent with the shape of a portion of the display substrate 1 facing the first side surface 201. A portion of the second side surface 202 of the spacer 2 away from the display side of the display substrate 1 corresponding to the arc surface region 101 of the display substrate 1 is set as a surface including a plane or a plurality of planes. In this way, when the panel bending pad 102 of the display panel 1 bent reversely is fixed on the second side surface 202 of the spacer 2, the portion of the panel bending pad 102 corresponding to the arc surface region 101 is not bent along an arc surface, but is in a planar state or only bent at a local position. Therefore, the bending stress of lines and films of the panel bending pad 102 can be reduced, occurrence of cracks can be prevented, and since the stress is reduced, the panel bending pad 102 can be tightly connected to the second side surface 202 of the spacer 2 to prevent peeling.

In some exemplary embodiments, as shown in FIG. 1, the display substrate 1 may further include a plane region 103 connected to the arc surface region 101. The arc surface region 101 is located between the plane region 103 and the panel bending pad 102. In the present embodiment, an outline shape of the display substrate 1 may be rectangular, and one or more arc surface regions 101 may be provided. The portions of the display substrate 1 close to the four sides may each be provided with the arc surface region 101, i.e., the display substrate 1 is four-side-curved. The plane region 103 is located in the middle portion of the display substrate 1. Correspondingly, the flexible display panel may be a four-side-curved display panel. The display substrate 1 may be made of a flexible material, such as a polyimide material.

In some exemplary embodiments, as shown in FIGS. 1 and 2, a display region of the display substrate 1 may include the plane region 103. A portion of the second side surface 202 of the spacer 2 corresponding to the plane region 103 may be a plane parallel to the plane region 103.

In some exemplary embodiments, as shown in FIGS. 1 and 2, the second side surface 202 of the spacer 2 may include a first plane 2021 corresponding to the arc surface region 101, and a second plane 2022 corresponding to the plane region 103. The first plane 2021 and the second plane 2022 are connected to each other and have an included angle therebetween.

In some exemplary embodiments, the included angle between the first plane 2021 and the second plane 2022 may be an obtuse angle that causes a smooth transition therebetween. For example, as shown in FIG. 2, the included angle α between the first plane 2021 and the second plane 2022 is an obtuse angle, which causes a smooth transition from the first plane to the second plane.

In some exemplary embodiments, as shown in FIG. 1, the display substrate 1 further includes a bending region 104 located between the arc surface region 101 and the panel bending pad 102. The panel bending pad 102 is bent to the side of the display substrate 1 away from the display side through the bending region 104.

The bending region 104 may be located in a non-display region of the display substrate 1, and may be a lead region (including a lead layer). That is, the bending region is located in a lead region in a non-display region of the display substrate.

In some exemplary embodiments, the bending region 104 may be coated with a protective adhesive 4.

For example, as shown in FIG. 1, the protective adhesive 4 may completely cover the bending region 104, and thicknesses of the protective adhesive at two ends of the bending region (including an end close to the arc surface region and an end close to the panel bending pad) are smaller than a thickness of the protective adhesive in a middle region.

In some exemplary embodiments, the protective adhesive 4 may be an ultraviolet curing protective adhesive (e.g., micro coating layer (MCL) adhesive), or a polyester urethane adhesive, etc., such that the lead layer of the bending region 104 may be located in a neutral layer (not stretched or compressed during bending) during the bending formation, thereby preventing the lead layer of the bending region 104 from being stretched and broken.

In some exemplary embodiments, the display substrate may be a display substrate curved on at least one side, including at least one arc surface region close to at least one side, a plane region in the middle, a bending region and a panel bending pad close to a short side of the display substrate.

Figure 3:
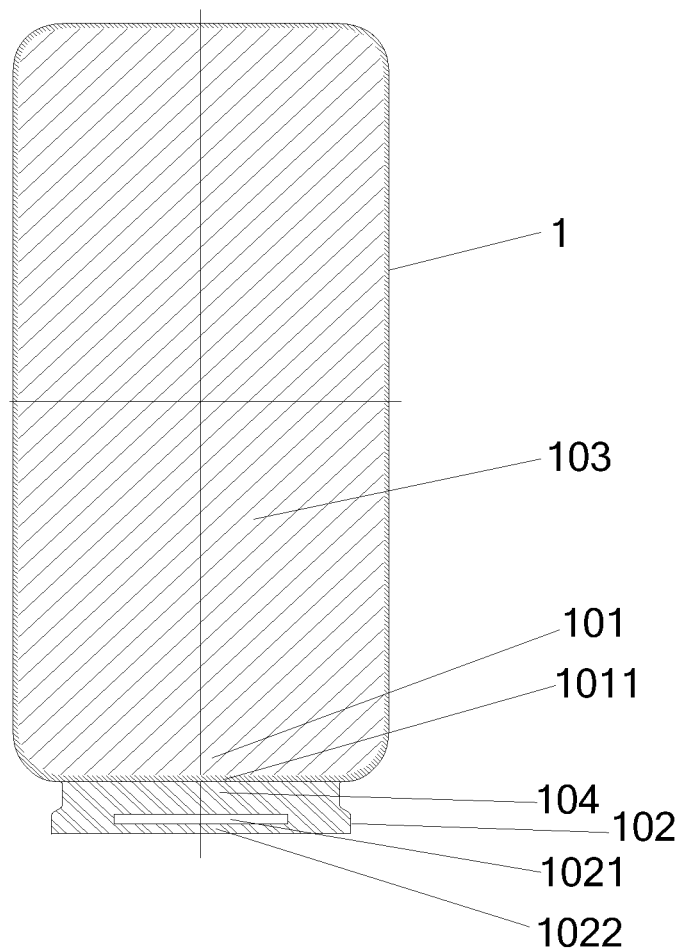
FIG. 3 is a plan view of an unfolded display substrate of a flexible display panel according to an embodiment of the present disclosure.

For example, as shown in FIG. 3, FIG. 3 shows a plan view of the display substrate 1 after being unfolded in one example. The display substrate 1 may be a four-side-curved display substrate including four arc surface regions 101 close to four sides, a plane region 103 in the middle, a bending region 104 and a panel bending pad 102 close to a short side of the display substrate 1. The display region of the display substrate 1 may include a plane region 103 and portions of the four arc surface regions 101 close to the plane region 103. The portions of the four arc surface regions 101 close to the four sides may be in a frame region 1011 (the non-display region). The non-display region of the display substrate 1 may include portions close to four sides of the four arc surface regions 101 (frame region 1011), a bending area 104, and a panel bending pad 102.

In some exemplary embodiments, the panel bending pad may be provided with a first bonding part in bonded connection with a drive chip, and a second bonding part in bonded connection with a flexible printed circuit of the flexible display panel.

For example, as shown in FIG. 3, the panel bending pad 102 may be provided with a first bonding part 1021 in bonded connection with a drive chip (drive IC), and a second bonding part 1022 in bonded connection with a flexible printed circuit of the flexible display panel.

In some exemplary embodiments, the second bonding part may be arranged close to an edge of the panel bending pad.

For example, as shown in FIG. 3, the second bonding part 1022 may be arranged close to an edge of the panel bending pad 102.

In some exemplary embodiments, as shown in FIG. 1, the panel bending pad 102 may be adhered to the second side surface 202 of the spacer 2. The panel bending pad 102 may be adhered to the second side surface 202 of the spacer 2 by an adhesive, a double-faced adhesive tape, etc.

In some exemplary embodiments, the flexible display panel further includes a back film attached to the side of the display substrate away from the display side. The second side surface of the spacer is adhered to the back film in the panel bending pad by an adhesive.

For example, as shown in FIG. 1, the flexible display panel may further include a back film 3 attached to the side of the display substrate 1 away from the display side. The second side surface 202 of the spacer 2 may be adhered to the back film 3 in the panel bending pad 102 by an adhesive.

In some exemplary embodiments, the back film is used for protecting the display substrate, and a portion of the back film corresponding to the bending region is of a hollow design.

For example, as shown in FIG. 1, the back film 3 may be used for protecting the display substrate 1, and a portion of the back film 3 corresponding to the bending region 104 may be of a hollow design, so that the problems of breakage, peeling, etc. of leads of the bending region 104 caused by squeezing the display substrate 1 during bending to form the bending region 104 can be avoided.

In some exemplary embodiments, as shown in FIG. 1, a material of the spacer 2 may include any one or more of silica gel, polyimide (PI), polypropylene (PP), and polymethylmethacrylate (PMMA). The spacer 2 may be manufactured by injection molding, etc.

According to the flexible display panel of the embodiments of the present disclosure, the spacer may play a supporting role. The shape of the first side surface of the spacer facing the display side of the display substrate is set to be consistent with the shape of a portion of the display substrate facing the first side surface of the spacer. A portion of the second side surface of the spacer away from the display side of the display substrate and corresponding to the arc surface region of the display substrate is set as a surface including a plane or a plurality of planes. In this way, when the panel bending pad of the display panel bent reversely is fixed on the second side surface of the spacer, the portion of the panel bending pad corresponding to the arc surface region is not bent along an arc surface, but is in a planar state or only bent at a local position. Therefore, the bending stress of lines and films of the panel bending pad is reduced to a certain extent, occurrence of cracks is prevented, and since the stress is reduced, the panel bending pad can be tightly connected to the second side surface of the spacer to prevent peeling.

Figure 6:
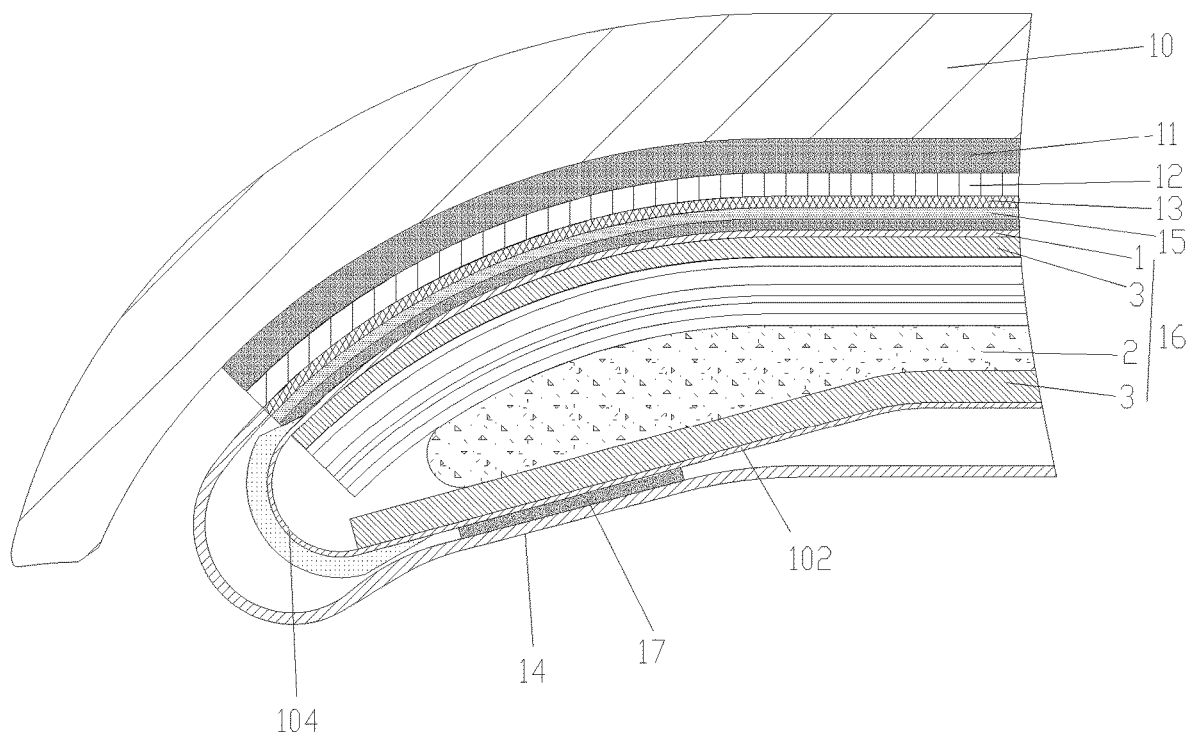
FIG. 6 is a partial cross-sectional view of the touch display module of FIG. 5 at A.

As shown in FIG. 6, an embodiment of the present disclosure further provides a touch display module, which includes: a flexible display panel 16 and a touch assembly arranged on a display side of the flexible display panel 16. The touch assembly includes a touch layer 13 and a flexible printed circuit 14 connected to the touch layer 13. The flexible printed circuit 14 is bent to a side of the flexible display panel 16 away from the display side. The flexible printed circuit 14 may be fixed on a panel bending pad 102 (by a double faced adhesive tape 17 or an adhesive).

The touch display module of the embodiment of the present disclosure may include the above flexible display panel 16, and the flexible printed circuit 14 (TFPC) of the touch assembly bent reversely is fixed on the panel bending pad 102 of the display substrate 1. In this way, since the portion of the panel bending pad 102 corresponding to the arc surface region 101 is in a planar state or only bent at a local position after being fixed on the second side surface 202 of the spacer 2, the flexible printed circuit 14 of the touch control assembly is easily fixed on the panel bending pad 102 of the display substrate 1 after being bent reversely, and is not easy to peel off the panel bending pad 102.

In some exemplary embodiments, the touch display module may further include: a polarizer arranged on a side of the touch layer away from the flexible display panel, and a cover plate arranged on the polarizer.

Figure 5:
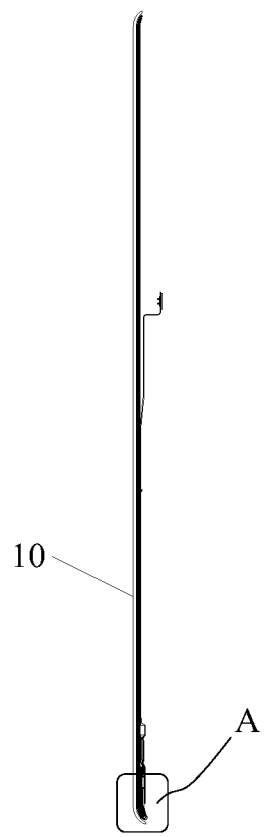
FIG. 5 is a side view of the touch display module of FIG. 4.

For example, as shown in FIGS. 5 and 6, the flexible display panel 16 may be an organic light-emitting diode (OLED) flexible display panel. The touch display module may further include: a polarizer 12 arranged on a side of the touch layer 13 away from the flexible display panel 16, and a cover plate 10 arranged on the polarizer 12.

In some exemplary embodiments, the cover plate 10 and the polarizer 12 may be adhered through a first adhesive layer 11 (which may be an optical clear adhesive (OCA)), and the touch control layer 13 and the flexible display panel 16 may be adhered through a second adhesive layer 15 (which may be an OCA).

In some exemplary embodiments, the flexible display panel 16 may have one or more curved sides, and correspondingly the touch display module may have one or more curved sides, such as four curved sides. When the touch display module has four curved sides, the cover plate 10 correspondingly has four curved sides.

Figure 4:
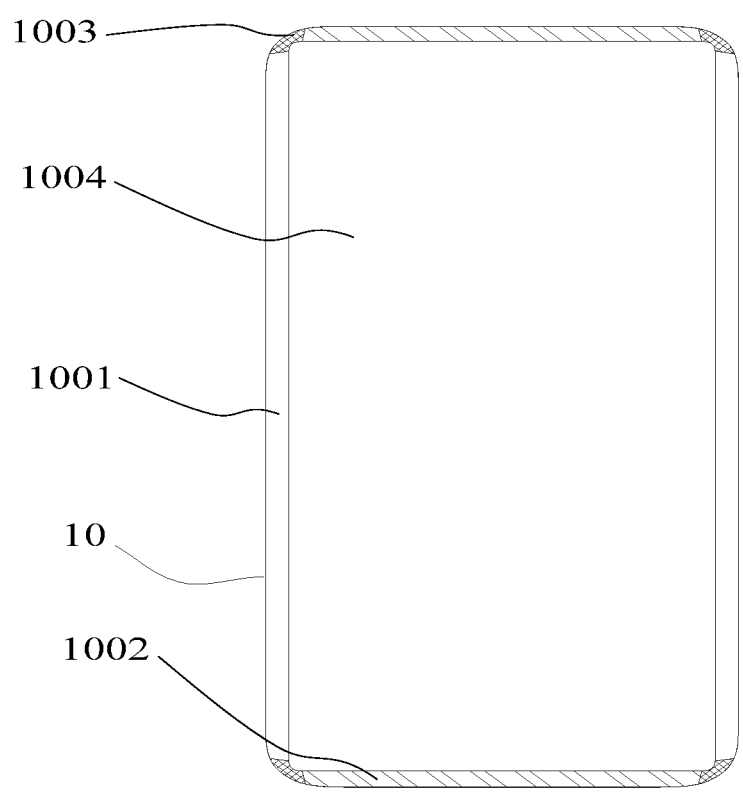
FIG. 4 is a top view of a display side of a touch display module according to an embodiment of the present disclosure.

For example, as shown in FIG. 4, FIG. 4 shows a top view of a display side of a touch display module. It can be seen from FIG. 4 that an outline shape of the cover plate 10 is rectangular, portions close to two long sides are long-side curved portions 1001, portions close to two short sides are short-side curved portions 1002, four corner portions are corner curved portions 1003, and a middle portion is a plane portion 1004.

The touch display module of the embodiments of the present disclosure includes the above flexible display panel, and the flexible printed circuit (TFPC) of the touch assembly bent reversely is fixed on the panel bending pad of the display substrate. In this way, since the portion of the panel bending pad corresponding to the arc surface region is in a planar state or only bent at a local position after being fixed on the second side surface of the spacer, the flexible printed circuit of the touch control assembly is easily fixed on the panel bending pad of the display substrate after being bent reversely, and is not easy to peel off the panel bending pad.

An embodiment of the present disclosure further provides a display device, which includes the flexible display panel.

An embodiment of the present disclosure further provides a display device, which includes the touch display module.

The display device of the embodiment of the present disclosure may be a device with a display function such as a mobile phone, a notebook, or a television.

In the descriptions of the embodiments of the present disclosure, unless otherwise specified and defined, terms "connection", "fixed connection", "installation", and "assembly" should be generally understood. For example, the term may be fixed connection or detachable connection or integral connection. The terms "installation", "connection", and "fixed connection" may be direct connection or indirect connection through an intermediate or communication inside two elements. Those of ordinary skill in the art may understand the meanings of the above terms in the embodiments of the present disclosure in specific situations.

What we claim is:

1. A flexible display panel, comprising: a display substrate and a spacer arranged on a side of the display substrate away from a display side, wherein the spacer comprises a first side surface facing the display side of the display substrate and a second side surface away from the display side of the display substrate;

the display substrate comprises an arc surface region close to an edge and a panel bending pad bent to the side of the display substrate away from the display side, the panel bending pad is fixed on the second side surface of the spacer; and a shape of the first side surface of the spacer is consistent with a shape of a portion of the display substrate facing the first side surface of the spacer, and a portion of the second side surface of the spacer corresponding to the arc surface region is a surface comprising a plane or a plurality of planes, wherein the panel bending pad is attached to the second side surface of the spacer, and wherein the flexible display panel further comprises: a back film attached to the side of the display substrate away from the display side, wherein the second side surface of the spacer is adhered to the back film in the panel bending pad by an adhesive.

2. The flexible display panel of claim 1, wherein the display substrate further comprises a plane region connected to the arc surface region, and the arc surface region is located between the plane region and the panel bending pad.

3. The flexible display panel of claim 2, wherein a display region of the display substrate comprises the plane region, and a portion of the second side surface of the spacer corresponding to the plane region is a plane parallel to the plane region.

4. The flexible display panel of claim 2, wherein the second side surface of the spacer comprises a first plane corresponding to the arc surface region and a second plane corresponding to the plane region, and the first plane and the second plane are connected to each other, and there is an included angle between the first plane and the second plane.

5. The flexible display panel of claim 4, wherein the included angle is an obtuse angle that causes a smooth transition from the first plane to the second plane.

6. The flexible display panel of claim 1, wherein the display substrate further comprises a bending region located between the arc surface region and the panel bending pad, and the panel bending pad is bent to the side of the display substrate away from the display side through the bending region.

7. The flexible display panel of claim 6, wherein the bending region is located in a lead region in a non-display region of the display substrate.

8. The flexible display panel of claim 6, wherein the bending region is coated with a protective adhesive.

9. The flexible display panel of claim 8, wherein the protective adhesive completely covers the bending region, and thicknesses of the protective adhesive at two ends of the bending region is smaller than a thickness of the protective adhesive in a middle region of the bending region.

10. The flexible display panel of claim 8, wherein the protective adhesive comprises an ultraviolet curing protective adhesive or a polyester urethane adhesive to enable a lead layer of the bending region to be located at a neutral layer during bending formation.

11. The flexible display panel of claim 1, wherein the back film is used for protecting the display substrate, and a portion of the back film corresponding to a bending region is of a hollow design.

12. The flexible display panel of claim 1, wherein a material of the spacer includes any one or more of silica gel, polyimide, polypropylene, and polymethylmethacrylate.

13. The flexible display panel of claim 1, wherein the display substrate is a display substrate curved on at least one side, comprising at least one arc surface region close to at least one side, a plane region in the middle, a bending region and a panel bending pad close to a short side of the display substrate.

14. The flexible display panel of claim 13, wherein the panel bending pad is provided with a first bonding part in bonded connection with a drive chip and a second bonding part arranged in bonded connection with a flexible printed circuit of the flexible display panel.

15. The flexible display panel of claim 14, wherein the second bonding part is arranged close to an edge of the panel bending pad.

16. A touch display module, comprising: the flexible display panel of claim 1 and a touch assembly arranged on a display side of the flexible display panel, wherein the touch assembly comprises a touch layer and a flexible printed circuit connected to the touch layer, the flexible printed circuit is bent to a side of the flexible display panel away from the display side, and the flexible printed circuit is fixed on the panel bending pad.

17. The touch display module of claim 16, further comprising: a polarizer arranged on a side of the touch layer away from the flexible display panel, and a cover plate arranged on the polarizer.

18. A display device, comprising: the touch display module of claim 16.

* * * * *